United States Patent [19]
Ubbens et al.

[11] Patent Number: 4,663,840
[45] Date of Patent: May 12, 1987

[54] METHOD OF INTERCONNECTING CONDUCTORS OF DIFFERENT LAYERS OF A MULTILAYER PRINTED CIRCUIT BOARD

[75] Inventors: Henricus D. U. Ubbens; Peer Langeveld, both of Eindhoven, Netherlands

[73] Assignee: U.S. Philips Corporation, New York, N.Y.

[21] Appl. No.: 803,357

[22] Filed: Dec. 2, 1985

[30] Foreign Application Priority Data

Dec. 11, 1984 [NL] Netherlands ......................... 8403755

[51] Int. Cl.$^4$ .............................................. H05K 3/40
[52] U.S. Cl. ......................................... 29/853; 29/830
[58] Field of Search ................................. 29/830, 853

[56] References Cited

U.S. PATENT DOCUMENTS

| | | | |
|---|---|---|---|
| 3,037,265 | 6/1962 | Kollmeier | 29/853 |
| 3,346,950 | 10/1967 | Schick | |
| 4,183,137 | 1/1980 | Lomerson | 29/853 |
| 4,319,708 | 3/1982 | Lomerson | 29/853 |

FOREIGN PATENT DOCUMENTS

| | | | |
|---|---|---|---|
| 2107591 | 8/1972 | Fed. Rep. of Germany. | |
| 1261039 | 1/1972 | United Kingdom | 29/830 |
| 1019682 | 5/1983 | U.S.S.R. | 29/830 |

*Primary Examiner*—Lowell A. Larson
*Attorney, Agent, or Firm*—F. Brice Faller

[57] ABSTRACT

The invention relates to a method of interconnecting conductors of different layers of a multilayer printed circuit board by forming a depression in the relevant conductor of the outermost layer, so that the insulation layer(s) is deformed and contact is made between the outermost layer and the appropriate conductor(s) of the next layer or layers.

The method can suitably be used in multilayer printed circuits on a substrate and in flexible multilayer printed circuits on an electrically insulating foil. In the latter case a temporary backing surface is required for the depression process. The substrate or the temporary backing surface must be deformable to a sufficient degree.

4 Claims, 4 Drawing Figures

METHOD OF INTERCONNECTING CONDUCTORS OF DIFFERENT LAYERS OF A MULTILAYER PRINTED CIRCUIT BOARD

BACKGROUND OF THE INVENTION

The invention relates to a method of manufacturing a multilayer printed circuit board, in which method conductors of different circuit layers are interconnected, by forming at least one depression in a first circuit layer at the location of the conductors to be interconnected, such that the relevant conductor of the first circuit layer contacts the relevant conductor or conductors of one or more other circuit layers.

A method of interconnecting printed circuit layers on opposite sides of an electrically insulating foil or of interconnecting two mutually insulated circuit layers of a printed circuit board is disclosed in U.S. Pat. No. 3,346,450. In this patent a depression technique is described in which a contact is formed between a first layer and a second layer without the second layer being pierced. The provisional connection thus formed must be electrically and mechanically reinforced by means of additional conductive material, for example, by plating copper or gold into the depression. In order not to penetrate the second layer, the method must be carried out against a hard backing surface which is not deformed during depression. In the method is applied to an electrically insulating foil provided with printed circuit layers, a hard backing surface is temporarily required. If it is applied to two circuit layers on one side of a printed circuit board the substrate should be sufficiently hard.

SUMMARY OF THE INVENTION

It is an object of the invention to provide a method of manufacturing printed circuit board having interconnected conductors in different layers, which enables the use of a less hard layer, such as a backing surface of any epoxy resin which has been reinforced with glass fibres, or other materials which are commonly used in printed circuit boards. Another object of the invention is to provide a method which can also be used in multilayer printed circuit boards comprising more than two circuit layers. Another object is to provide a method in which the contact between the circuit layers is of such quality at the location of a depression that further reinforcing of the contact by means of additional conductive matter can be dispensed with.

According to the invention, the multilayer printed circuit board is placed on a deformable substrate at least during the depression process, and the first circuit layer is depressed beyond the level of the other circuit layer(s), thus bringing about such a deformation of the circuit layers and the layer(s) of insulation between the circuit layers, that the circuit layers become interconnected at the location of the depression.

A method is known from German Patent Specification DE No. 2 107 591 for interconnecting conductors on opposite sides of a flexible foil, the first layer being depressed beyond the level of the second layer, but the layers are not brought into mechanical contact and the electrically conductive connection is not realized until a lug formed by the depression is bent further and soldered. The method in accordance with the German Patent Specification can only be used on a flexible foil without a permanent backing surface. Moreover, this method acquires the use of a die.

In a multilayer printed circuit board in accordance with a very efficient embodiment of the invention, one side of a deformable substrate is provided with permanent circuit layers and insulation layers. Thus, the substrate and the circuit layers and insulation layers together make up a printed circuit board.

If desired, the connection can be further reinforced after piercing, for example, by means of a flow-soldering operation in which solder-screening lacquer is provided on the board outside the areas where the connections are to be made. In this flow-soldering operation, older is provided in the cavities formed by piercing. The soldering points thus formed are suitable for mounting electronic components without terminal leads. After temporary fixation by means of an adhesive, the components can be mounted in the same or in a separate soldering operation.

The method in accordance with the invention may also be applied to a flexible electrically insulating foil having conductor layers on both sides. When the depression is formed, the foil is placed on a temporary backing plate which can be deformed to a sufficient degree. Thermoplastic is most suitable for this purpose; if necessary, the deformation requirement can be met by raising the temperature.

When the method of the invention is used for interconnecting the conductors on opposite sides of a flexible foil, the cavity may have parallel sides because the deformation of the material of the temporary backing substrate during depression produces such a counterpressure that the material originally situated above this backing substrate is deformed to such an extent that it is clamped in the cavity.

DESCRIPTION OF THE PREFERRED EMBODIMENTS

Figure 1:
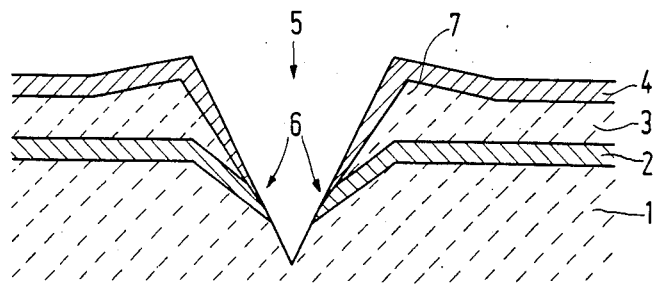
FIG. 1 is a cross-sectional view of a depression formed by means of a conical depression tool.

FIG. 1 is a cross-sectional view of a part of a substrate 1 which supports conductor layers 2 and 4 which are separated from each other by an insulating layer 3. Substrate 1 is formed from a material which is commonly used in the art, such as glass fibre-reinforced epoxy resin having a layer thickness of 1.5 mm and a glass-transition temperature of 125° C. The glass fibres should preferably not be arranged in a mesh-like pattern, especially in the insulating layer 3 to allow a depression to be made independently of its location. The conductor layers 2 and 4 consist of, for example, 35 $\mu$m thick patterned copper layers. Insulating layer 3 may be of the same material as substrate 1, having a thickness of, for example, 75 $\mu$m. The layers can be bonded together by means of a known compression method.

By means of a conical depression tool of hardened steel, a depression 5 is formed so that conductor layer 4 is presed beyond conductor layer 2. This results in an annular contact 6 between conductor layers 2 and 4. A bulge 7 is produced around depression 5 due to the accumulation, amongst other, of deformed insulation material 3. Bulge 7 is of small dimensions and in contrast to bent and soldered lugs, it doe not hamper the further mechanical processing of the multilayer printed circuit board. In the case of conductors with a width of 0.5 mm, a depression with a diameter of 0.2 mm is used.

Figure 2:
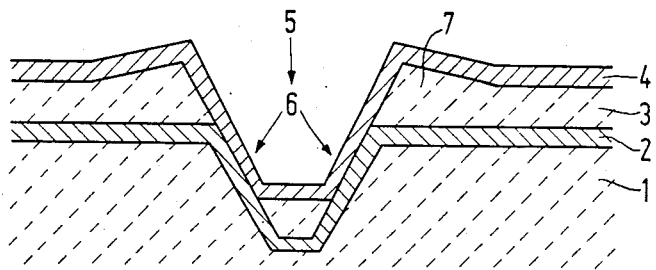
FIG. 2 is a cross-sectional view of a depression formed by means of a frustoconical tool.

In FIG. 2, which is a cross-sectional view of part of a multilayer printed circuit board similar to that shown in FIG. 1, corresponding elements bear the same reference numerals. In this case, use is made of a frustoconical depression tool.

In the embodiments shown in FIG. 1 and FIG. 2, the connection can be further reinforced by providing a conductive material, for example, solder, in the depression 5. In the case of FIG. 1, the connection between layers 2 and 4 will be improved at the area of contact 6; in the case of FIG. 2, the connection will improve if layer 4 is cut due to the deformation of said layer.

Figure 3:
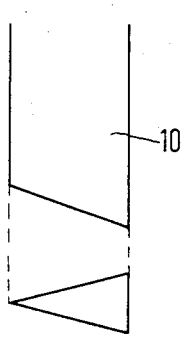
FIG. 3 and FIG. 4 are alternative embodiments of depression tools for use in the method of the invention.
Figure 4:
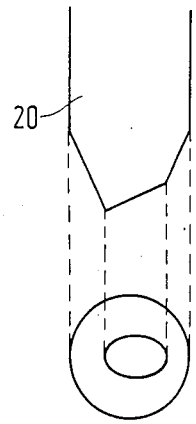

Depending upon the tools used for piercing or depressing, the section of the contact thus formed may look differently in detail. Non-symmetrical depression tools are also suitable. FIG. 3 shows a triangular depression tool by means of which a trapezium-shaped depression can be formed. FIG. 4 shows an obliquely truncated conical depression tool by means of which the elliptical depression can be formed. A suitable shape of such a truncated cone is defined by an apex angle of the cone of approximately 50°, the end face making an angle of 70° with the axis of the cone, and the major axis of the ellipse of the end face having a length of 0.2 mm. In order to obtain the desired result, the above-mentioned dimensions have to be adapted to the material selected and to the layer thicknesses.

What is claimed is:

1. A method of manufacturing a multilayer printed circuit board having plural circuit layers separated by at least one deformable insulation layer, in which method conductors of different layers are interconnected by forming at least one depression in a first circuit layer at the location of the conductors to be interconnected, such that the insulation is deformed until the relevant conductor of the first circuit layer contacts the relevant conductor or conductors of one or moe other circuit layers, characterized in that the multilayer printed circuit board is placed on a deformable substrate at least during the depression process, and in that the first circuit layer is depressed beyond the level of the other circuit layer(s), thus bringing about such a deformation of the circuit layers and the layer(s) of insulation between the circuit layers, that the circuit layers become interconnected at the location of the depression.

2. A multilayer printed circuit board in which conductors of different layers are interconnected, manufactured according to the method as claimed in claim 1, characterized in that one side of a deformable substrate is provided with a stack of permanent circuit layers and insulation layers.

3. A method of interconnecting conductors of different circuit layers of a multilayer printed circuit board of the type comprising a deformable insulating layer with conductor layers on opposite sides thereof, said method comprising the steps of placing said board on a deformable substrate, depressing a first conductor layer at the location of the conductors to be interconnected, said first conductor layer being depressed beyond the level of the other conductor layers, thereby deforming the layer of insulation therebetween, said conductor layers and layer of insulation therebetween being so deformed that the conductors are interconnected at the location of the depression, said board remaining on said substrate at least during the depression process.

4. The method of claim 3 wherein said first conductor layer and said other conductor layer are pierced.

* * * * *